(12) United States Patent
Leo et al.

(10) Patent No.: US 7,598,519 B2
(45) Date of Patent: Oct. 6, 2009

(54) TRANSPARENT LIGHT-EMITTING COMPONENT

(75) Inventors: Karl Leo, Dresden (DE); Vadim Lyssenko, Dresden (DE); Robert Gelhaar, Dresden (DE)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 11/420,346

(22) Filed: May 25, 2006

(65) Prior Publication Data

US 2006/0284170 A1  Dec. 21, 2006

(30) Foreign Application Priority Data

May 27, 2005  (EP) ................... 05011427
Jul. 12, 2005  (EP) ................... 05015072

(51) Int. Cl.
*H01L 35/24* (2006.01)

(52) U.S. Cl. .................. 257/40; 257/98; 257/E51.018; 257/E51.019; 257/E51.02; 257/E51.021; 257/E51.022

(58) Field of Classification Search .................. 257/40, 257/98, E51.018–E51.022
See application file for complete search history.

(56) References Cited

U.S. PATENT DOCUMENTS

| | | | |
|---|---|---|---|
| 3,644,770 A | 2/1972 | Bell | |
| 3,673,011 A | 6/1972 | Strull | |
| 3,913,999 A | 10/1975 | Clarke | |
| 4,066,569 A | 1/1978 | Lim | |
| 4,356,429 A | 10/1982 | Tang | |
| 4,618,453 A | 10/1986 | Kim | |
| 4,769,292 A | 9/1988 | Tang et al. | |
| 5,093,698 A | 3/1992 | Egusa | |
| 5,110,835 A | 5/1992 | Walter et al. | |
| 5,247,226 A | 9/1993 | Sato et al. | |

(Continued)

FOREIGN PATENT DOCUMENTS

AU  2003229476  9/2003

(Continued)

OTHER PUBLICATIONS

Deshpande et al., White-light-emitting organic electroluminescent devices based on interlayer sequential energy transfer, Applied Physics Letters, vol. 75, p. 888-890, 1999.*

(Continued)

*Primary Examiner*—Kiesha L Rose
*Assistant Examiner*—Minchul Yang
(74) *Attorney, Agent, or Firm*—Sutherland, Asbill & Brennan, LLP

(57) ABSTRACT

The invention concerns a transparent light-emitting component, in particular an organic light-emitting diode (OLED), with a layer arrangement in which a light-emitting organic layer is arranged between an upper and a lower electrode, the layer arrangement being transparent in a switched-off state and emitting light which is produced in the light-emitting organic layer by applying an electric voltage to the upper and the lower electrode in a switched-on state, which light is radiated in a ratio of at least approximately 4:1 through the upper or the lower electrode and where a stack, which is transparent in the visible spectral region, of dielectric layers is arranged on the side of the upper or the lower electrode.

11 Claims, 2 Drawing Sheets

U.S. PATENT DOCUMENTS

Figure 1:
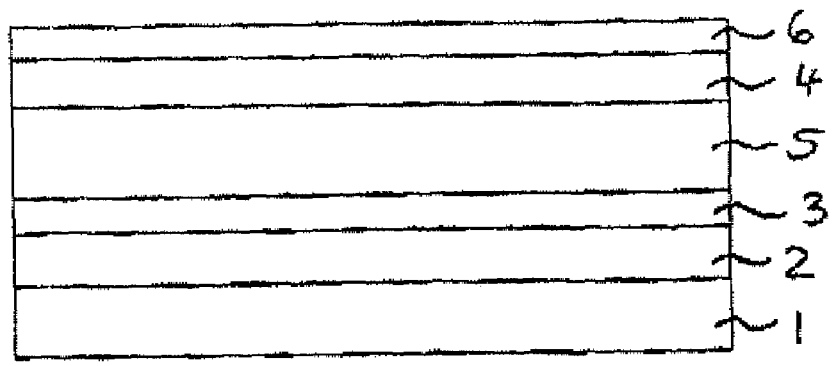

| | | | |
|---|---|---|---|
| 5,292,881 A | 3/1994 | Berneth et al. | |
| 5,556,524 A | 9/1996 | Albers | |
| 5,703,436 A | 12/1997 | Forrest et al. | |
| 5,736,881 A | 4/1998 | Ortiz | |
| 5,757,026 A | 5/1998 | Forrest et al. | |
| 5,811,833 A | 9/1998 | Thompson | |
| 5,834,893 A * | 11/1998 | Bulovic et al. | 313/506 |
| 5,840,217 A | 11/1998 | Lupo et al. | |
| 5,969,474 A | 10/1999 | Aria | |
| 6,013,384 A | 1/2000 | Kido et al. | |
| 6,046,543 A | 4/2000 | Bulovic et al. | |
| 6,111,696 A * | 8/2000 | Allen et al. | 359/495 |
| 6,160,828 A * | 12/2000 | Kozlov et al. | 372/39 |
| 6,303,238 B1 | 10/2001 | Thompson et al. | |
| 6,310,360 B1 | 10/2001 | Forrest et al. | |
| 6,350,534 B1 | 2/2002 | Boerner et al. | |
| 6,406,804 B1 | 6/2002 | Higashi | |
| 6,414,661 B1 | 7/2002 | Shen | |
| 6,423,429 B2 | 7/2002 | Kido et al. | |
| 6,437,769 B1 | 8/2002 | Kohayashi | |
| 6,476,550 B1 | 11/2002 | Oda | |
| 6,501,230 B1 | 12/2002 | Feldman | |
| 6,555,840 B1 | 4/2003 | Hudson et al. | |
| 6,566,807 B1 | 5/2003 | Fujita et al. | |
| 6,573,651 B2 | 6/2003 | Adachi et al. | |
| 6,579,422 B1 | 6/2003 | Kasinuma | |
| 6,614,161 B1 | 9/2003 | Jacobsen et al. | |
| 6,620,528 B1 | 9/2003 | Yamazaki | |
| 6,630,684 B2 | 10/2003 | Lee | |
| 6,645,645 B1 | 11/2003 | Adachi et al. | |
| 6,700,058 B2 | 3/2004 | Nelles et al. | |
| 6,720,573 B2 | 4/2004 | Son | |
| 6,734,457 B2 | 5/2004 | Yamazaki | |
| 6,747,287 B1 | 6/2004 | Toguchi et al. | |
| 6,809,333 B2 | 10/2004 | Ishikawa et al. | |
| 6,835,470 B1 | 12/2004 | Magain | |
| 6,837,939 B1 | 1/2005 | Klug | |
| 6,867,538 B2 | 3/2005 | Adachi | |
| 6,878,297 B1 | 4/2005 | Berger et al. | |
| 6,897,473 B1 | 5/2005 | Burroughes et al. | |
| 6,900,588 B2 | 5/2005 | Adachi et al. | |
| 6,933,522 B2 | 8/2005 | Lin | |
| 6,965,197 B2 | 11/2005 | Tyan | |
| 7,001,536 B2 | 2/2006 | Thompson et al. | |
| 7,012,363 B2 | 3/2006 | Weaver | |
| 7,074,500 B2 | 7/2006 | Pleiffer | |
| 7,141,817 B2 | 11/2006 | Nishi | |
| 7,161,292 B2 | 1/2007 | Leo | |
| 7,256,541 B2 | 8/2007 | Birnstock | |
| 7,345,300 B2 | 3/2008 | Qin | |
| 2001/0026124 A1 | 10/2001 | Liu et al. | |
| 2001/0035713 A1 | 11/2001 | Kimusra | |
| 2001/0038102 A1 | 11/2001 | Kawase | |
| 2001/0055841 A1 | 12/2001 | Yamazaki et al. | |
| 2002/0015807 A1 | 2/2002 | Sugino et al. | |
| 2002/0084993 A1 | 7/2002 | Teneya | |
| 2002/0098379 A1 | 7/2002 | Arakane | |
| 2003/0020073 A1 | 1/2003 | Long et al. | |
| 2003/0062636 A1 | 4/2003 | Chen | |
| 2003/0085652 A1 | 5/2003 | Weaver et al. | |
| 2003/0122813 A1 | 7/2003 | Ishizuki | |
| 2003/0127973 A1 | 7/2003 | Weaver et al. | |
| 2003/0146443 A1 | 8/2003 | Tokuda et al. | |
| 2003/0146888 A1 | 8/2003 | Yamazaki | |
| 2003/0164679 A1 | 9/2003 | Hamano et al. | |
| 2003/0184505 A1 | 10/2003 | Inukai | |
| 2003/0186080 A1 | 10/2003 | Kamatani et al. | |
| 2004/0012980 A1 | 1/2004 | Sigiura et al. | |
| 2004/0033388 A1 | 2/2004 | Kim et al. | |
| 2004/0065544 A1 | 4/2004 | Igarashi et al. | |
| 2004/0066824 A1 | 4/2004 | Magno et al. | |
| 2004/0069995 A1 | 4/2004 | Magno et al. | |
| 2004/0070558 A1 | 4/2004 | Cok | |
| 2004/0113547 A1 | 6/2004 | Son | |
| 2004/0183963 A1 | 9/2004 | Nakamura | |
| 2004/0227446 A1 | 11/2004 | Fujimoto et al. | |
| 2004/0251816 A1 | 12/2004 | Leo et al. | |
| 2004/0262576 A1 | 12/2004 | Thompson et al. | |
| 2005/0040390 A1 | 2/2005 | Pleiffer et al. | |
| 2005/0041293 A1 | 2/2005 | Wada et al. | |
| 2005/0072971 A1 | 4/2005 | Marrocco et al. | |
| 2005/0110009 A1 | 5/2005 | Blochwitz-Nimoth et al. | |
| 2005/0142379 A1 | 6/2005 | Juni et al. | |
| 2005/0145179 A1 | 7/2005 | Catteneo | |
| 2005/0179399 A1 | 8/2005 | Leo | |
| 2005/0236973 A1 | 10/2005 | Leo et al. | |
| 2005/0280766 A1 | 12/2005 | Johnson et al. | |
| 2006/0033115 A1 | 2/2006 | Blochwitz et al. | |
| 2006/0038170 A1 | 2/2006 | Brunschwiler et al. | |
| 2006/0044227 A1 | 3/2006 | Hadcock | |
| 2006/0049397 A1 | 3/2006 | Pfeiffer | |
| 2006/0050032 A1 | 3/2006 | Gunner et al. | |
| 2006/0071206 A1 | 4/2006 | Stossell et al. | |
| 2006/0079004 A1 | 4/2006 | Werner | |
| 2006/0214888 A1 | 9/2006 | Schneider | |
| 2006/0231843 A1 | 10/2006 | Qin et al. | |
| 2006/0250076 A1 | 11/2006 | Hofmann | |
| 2006/0273310 A1 | 12/2006 | Birnstock | |
| 2006/0279227 A1 | 12/2006 | Burqhart | |
| 2007/0035236 A1 | 2/2007 | Murano | |
| 2007/0051946 A1 | 3/2007 | Walzer | |
| 2007/0145355 A1 | 6/2007 | Werner | |
| 2007/0252140 A1 | 11/2007 | Limmert | |
| 2007/0278479 A1 | 12/2007 | Werner et al. | |
| 2008/0048557 A1 | 2/2008 | Birnstock | |
| 2008/0121870 A1 | 5/2008 | Seth et al. | |
| 2008/0143250 A1 | 6/2008 | Blochwitz-Nimoth | |
| 2008/0164807 A1 | 7/2008 | Hofmann | |
| 2008/0203406 A1 | 8/2008 | He | |

FOREIGN PATENT DOCUMENTS

| | | |
|---|---|---|
| CA | 2463377 | 8/2003 |
| DE | 19732828 | 2/1999 |
| DE | 19916745 | 10/2000 |
| DE | 10009204 | 8/2001 |
| DE | 10135513 | 2/2003 |
| DE | 10207859 | 9/2003 |
| DE | 10229231 | 1/2004 |
| DE | 10251986 | 5/2004 |
| DE | 10261609 | 8/2004 |
| DE | 10307125 | 8/2004 |
| EP | 0625843 | 11/1994 |
| EP | 1018718 | 7/2000 |
| EP | 1227466 | 7/2002 |
| EP | 1282101 | 2/2003 |
| EP | 1318499 | 6/2003 |
| EP | 1365633 | 11/2003 |
| EP | 1476881 | 11/2004 |
| EP | 1548856 | 6/2005 |
| EP | 1435761 | 5/2006 |
| GB | 239203 | 2/1926 |
| GB | 2361356 | 10/2001 |
| GB | 2388236 | 11/2003 |
| GB | 2390215 | 12/2003 |
| JP | 59031865 | 2/1984 |
| JP | 7057873 | 3/1995 |
| JP | 2002 216975 | 8/2002 |
| JP | 2004119197 | 4/2004 |
| JP | 2004235168 | 8/2004 |
| JP | 2005108672 | 4/2005 |
| TW | 200306437 | 11/2003 |
| TW | 1226499 | 1/2005 |
| WO | 9619792 | 6/1996 |

| WO | 9828767 | 7/1998 |
| WO | 9948160 | 9/1999 |
| WO | WO 0076008 A | 12/2000 |
| WO | 0108230 | 2/2001 |
| WO | 0127910 | 4/2001 |
| WO | 0193642 | 12/2001 |
| WO | 0237580 | 5/2002 |
| WO | 0241414 | 5/2002 |
| WO | 02093664 | 11/2002 |
| WO | 03061028 | 7/2003 |
| WO | 03069958 | 8/2003 |
| WO | 03070822 | 8/2003 |
| WO | 03088271 | 10/2003 |
| WO | 03094140 | 11/2003 |
| WO | 2004004421 | 1/2004 |
| WO | 2004025615 | 3/2004 |
| WO | 2004059606 | 7/2004 |
| WO | 2005051525 | 6/2005 |
| WO | 2005086251 | 9/2005 |

OTHER PUBLICATIONS

C.W. Tang et al., Organic electroluminescent diodes, Applied Physics Letters, vol. 51, 12, Sep. 21, 1987, pp. 913-915.

Gufeng He et al, High-efficiency and low-voltage p-i-n electrophosphorescent organic light-emitting diodes with double-emission layers, Applied Physics Letters, vol. 85, 17, Oct. 25, 2004, pp. 3911-3913.

J.H. Burroughes et al., Light-emitting diodes based on conjugated polymers, Nature, vol. 347, Oct. 11, 1990, pp. 539-541.

G. Gu et al., Transparent organic light emitting devices, Applied Physics Letters, vol. 68, 19, May 6, 1996, pp. 2606-2608.

H.A. Macleod, Thin Film Optical Fibers, 3rd ed., IOP Publishing, 2001, pp. 191-192.

G. Parthasarathy et al., High-efficiency transparent light-emitting devices, Applied Physics Letters, vol. 76, 15, Apr. 10, 2000, pp. 2128-2130.

Baumgartel, H. et al., "Polarograhische untersuchungen zur konformation von 1.2.3.4.5.—pentaarylimidazoliumkationen," Ber. Bunsenges (1972) 76/2, 94-100.

Baumgartel, H. et al., "Uber eine neue synthese von tetraaryl-imidazolen und Pentaarylimidazolium—saleen," Chem. Ber. (1968), 101, 3504.

Beckert, R. et al., "Syntheses and properties of cycloamidines based on 4H-imidazoles", Z. Naturforschung B, vol. 61, No. 4 (2006) p. 3504-3516.

Birnstock, J. et al., "High Efficiency Top Emitting OLEDs on a-Si Active Matrix Backplanes with Large Aperture Ratio," OLED1: Panel, IDW '04, Dec. 8, 2004.

Cocchi, M. et al., "Highly efficient organic electroluminescent devices based on cyclometallated platinum complexes as new phosphorent emitters," Synthetic Metals, 147, 253-256, (2004).

Cocchi, M. et al., "Highly efficient organic electroluminescent light-emitting diodes with a reduced quantum efficiency roll off at large current densities," Applied Physics Letters, 84, 7, 1052-1054 (2004).

Cotton, F. et al., "Closed-shell molecules that ionize more readily than cesium," Science, vol. 298, No. 5600, pp. 1971-1974 (Dec. 6, 2002).

Davison, A. et al., "Further Examples of Complexes Related by Electron-Transfer Reactions: Complexes Derived from Bis9trifluoromethyl)-1,2-dithietene," Inorg. Chem. (1964) 3/6 p. 814.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Gareau, Y. et al. "Free Radical Reaction of Diisopropyl Xanthogen Disulfide with Unsaturated Systems," Heterocycles (1998) 48, p. 2003.

Gebauer, T. et al., "Mesoionic bora-tetraazapentalenes—fully reversible two step redox systems," Chemical Communications (2004), (16), 1860-1861.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Huang, et al., "Synthesis of Perfluoro-2-alkynenitriles," Tetrahedron Letters (1981) 22, p. 5283.

Koch, N. et al., "Optimized hole Injection with Strong Acceptors at Organized-Metal Interfaces," Phys. Rev. Lett., vol. 95, pp. 237601-3, Nov. 30, 2005.

Krebs et al., "Strained Cyclic Acetylenes, VII Addition of Sulfur and Pyridine-N-Oxide to Seven Membered Cycloalkynes," Heterocycles (1979) 12, p. 1153.

Krespan, C.G.; "Bis-(polyfluoroalkyl)-acetylenes. IV. Fluorinated Dithietenes and Related Heterocyclic Compounds From Bis-(polyfluoroalkyl)-acetylenes and Sulfur," J.Am. Chem. Soc. (1961) 83, 3434.

Marder et al., "Synthesis, Optical Properties, Crystal Stuctures and Phase Behavior of Selectively Fluorinated 1,4-bis(4'-pyridylethynyl)benzenes, 4-(phenylethynyl)pyridines and 9,10-bis(4'-pyridylethynyl)-anthracene, and a Zn(NO3)2 Coordination Polymer," J. Mater. Chem. (2004) 14, 2395.

Mayer, R., et al. "Synthese der 1,3-Dithiol-2-thione," Angew. Chem. (1964) 76, p. 143.

Muramatsu, T. et al, "Visible Light Sensitive Cyclomer and Its Tautomeric Dispiro Compound Formed from Bispyridiny Diradical," J. Am. Chem. Soc. 2005, 127, 4572-3.

Muramatsu, T. et al., "Photosensitive Cyclomer Formation of 1,1'-(1,2-ethanediyl)bis(pyridinyl) diradical and its derivativese," J. Am. Chem. Soc. 1989, 111, 5782-7.

Nakayama, J. et al., "A Convenient Synthesis of 1,2-Dithietes and 1,2-Dithioxo Compounds Stabilized by Buttressing and Resonance Effects, Respectively, by Sulfuration of Alkynes with Elemental Sulfur," Bull. Chem. Soc. Jpn. (1993) 66, p. 623.

Schrauzer, et al. "Preparation, Reactions, and Structure of Bisdithio-A-diketone Complexes of Nickel, Palladium, and Platinum," J. Am. Chem. Soc. (1965) 87/7 1483-9.

Schrauzer, et al. "Reaktionen von Ubergangsmetallsulfiden mit Alkinen. Zur Kenntnis von Metallkomplexen der-A. B. Dithiodiketon," Z. Naturforschg. (1964) 19b, 192-8.

Schwarz, W M, et al, "Formation of stable free radicals on electroreduction of N-alkylpyridinium salts," J. Am. Chem. Soc. 33, 3164 (1961).

Sonogahsira, et al., "A Convenient Synthesis of Acetylenes: Catalytic Substitutions of Acetylenic Hydrogen with Bromoalkenes, Iodoarenes, and Bromopyridines." Tetrahedron Letters (1975) 50, 4467.

Vaid T. P. et al, "Investigations of the 9,10-diphenylacridyl radical as an isostructural dopant for the molecular semiconductor 9, 10-diphenylanthracene," Chemistry of Materials, American Chemical Society, Bd. 15, Nr. 22, 4292-4299 (2003).

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Tang, C. W., et al., "Electroluminescence of doped organic thin films," Journal of Applied Physics, (1989), vol. 65:9, pp. 3610-3616.

Tobat P., I. Saragi et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo, et al., "Improvement of emission efficiency in polymer light-emitting devices based on phosphorescent polymers," Thin Solid Films, Dec. 15, 2003, vol. 445, No. 2, pp. 353-357.

Tong B. Tang et al., "Ionization thresholds of merocyanine dyes in the solid state," Journal of Applied Physics, vol. 59, (1), Jan. 1986, pp. 5-10.

Tsujimura, T., et al., SID 03 Digest, "A 20-inch OLED display driven by super-amorphous-silicon technology," pp. 6-9.

Tsutsui, Tetsuo, et al., "High quantum efficiency in organic light emitting devices with iridium-complex as a triplet emissive center," Jps. Journal of Applied Physics, part 2 letters, (1999), vol. 38:12B, pp. L1502-L1504.

Von Jurgen Kauphold, Ber. Bunsen. Phys. Chem. 69, pp. 168-179.

W. B. Jensen, The Generalized Lewis Acid Based Concepts, John Wiley & Sons, New York, 1980, pp. 113-195.

Horst, "Use of metal complexes as emitter in an organic light-emitting component and such a componet," U.S. Appl. No. 12/159,520.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Weiying Gao et al., "Effect of electrical doping on molecular level alignment at organic-organic heterojunctions," Applied Physics Letters, vol. 82, No. 26, Jun. 30, 2003, pp. 4815-4817.

Wenping Hu et al., "Efficient red electroluminescence from devices having multilayers of a europium complex," Appl. Phys. Lett. vol. 77, No. 26, Dec. 25, 2000.

X. Zhou et al., "Low-voltage inverted transparent vacuum deposited organic light-emitting diodes using electrical doping," Applied Physics Letters, vol. 81, No. 2, Jul. 29, 2002, pp. 922-924.

X. Zhou et al., "Very low operating voltage organic light-emitting diodes using a p-doped amorphous hole injection layer," Applied Physics Letters, vol. 78, No. 4, Jan. 22, 2001, pp. 410-412.

Yamasaki, T et al., "Organic Light emitting device with an ordered monolayer of silica microspheres as a scattering medium," Appl. Phys. Lett., vol. 76, pp. 1243-1245, Mar. 2000.

Yao Fu et al., "Quantum-chemical predictions of Absolute standard redox potentials of diverse organic molecules and free radicals in acetonitrile," J. Am. Chem. Soc. 2005, 127, pp. 7227-7234.

Yasuhiko Shirota et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Yasuhiko Shirota, "Organic materials for electronic and optoelectronic devices," Journal of Materials Chemistry, 2000, vol. 10, pp. 1-25.

Yersin, H. and Douges, D., Topics in Curr. Chem. 2001, 214, 81.

Zhi-Ming Zhang, "Organic light emitting diodes based on new oxadiazole and pyrazoline derivatives," China Physics Letters, 2000, vol. 17, No. 6, pp. 454-456.

Zhou C. et al., "Modulated chemical doping of individual carbon nanotubes," Science, American Association for the Advancement of Science, vol. 290, No. 5496, pp. 1552-1555.

Huang, Jingsong, et al., "Low operating voltage and high-efficiency organic multilayer electroluminescent devices with p-type doped hole injection layer," Jps. J. Appl. Phys., (2001), vol. 40, pp. 6630-6633.

Hung, L. S., et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Loannidis, A., et al., "Hole and electron transport in chloroaluminum phtalocyanin thin films," The Journal of Physical Chemistry B, 1997, vol. 101, pp. 5100-5107.

Ishii, M. et al., J. Lumin., 1165 (2000).

J.D. Anderson et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Jefferson, Alan M. and Suschitzky, H., "New Route to Nucleophillically Substituted o-phenylenediamines," J. C.S. Chem. Comm. pp. 189-190, 1997.

Jingson Huang et al., "Low-voltage organic electroluminescent devices using pin structures," Applied Physics Letters, vol. 80, No. 1, Jan. 7, 2002, pp. 139-141.

Uchida Masahiro, JP Patent Abstracts, vol. 2003, No. 12, Dec. 5, 2003.

Juno Endo et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Junji Kido et al., "Bright Organic Electroluminescent Devices Having a Metal-doped Electron-injecting Layer," Applied Physics Letters, vol. 73, No. 20, Nov. 16, 1998, pp. 2866-2868.

Juni Kido, "Recent progress in organic light-emitting devices," Proceedings of the 1st International Display Manufacturing Conference IDMC 2000, Seoul Korea, Sep. 5, 2000, pp. 399-400.

Katsuyuki Naito, et al., "Molecular design, synthesis, and physical properties of nonpolymeric amorphous dyes for electron transport," The Journal of Physical Chemistry A, 1997, vol. 101, pp. 2350-2357.

Kin-Ya Akiba, et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, 1979.

Kwong, Raymond C., et al., "High operational stability of electrophosphorescent devices," Applied Physics Letters, Jul. 1, 2002, vol. 81, No. 1, pp. 162-164.

L. L. Miller et al., "A simple comprehensive correlation of organic oxidation and ionization potentials," J. Org. Chem., 1972, vol. 37, No. 6, pp. 916-918.

Lampert, M.A., Rep. Progr. Phys. 27, 329 (1964).

Lih, J., et al al., SID 03 Digest, "A phosphorescent active-matrix OLED display driven amorphous silicon backplane," pp. 14-17.

Lo, K. M., et al., J. Organometal. Chem. 1992, 430, 149.

Ludvik, J. and Pragst, F. et al., "Electrochemical generation of triplet states," Journal of Electroanalytical Chemistry, No. 180, pp. 141-156, 1984.

Lupton, J. M. et al., "Bragg scattering from periodically microstructured light emitting diodes," Appl. Phys. Lett., vol. 77, pp. 3340-3342, Nov. 2000.

M. Maitrot et al., "Molecular material based junctions: Formation of a Schottky Contact with Metallophthalocyanine Thin Films Doped by the Cosublimation Method," J. Applied Physics, 60(7), Oct. 1, 1986, pp. 2396-2400.

Murano, S., "Organic Component," U.S. Appl. No. 12/158,482.

Madigan, C.F., "Improvement of Output coupling efficiency of organic light emitting diodes by backside substrate modification," Appl. Phys. Lett., vol. 76, pp. 1650-1652, Mar. 2000.

Massimo Curini Curini, et al., "Ytterbium Triflate Promoted Synthesis of Benzimidazole Derivatives," Synlett, No. 10, pp. 1832-1834, 2004.

Matsumura M., et al., Applied Physics Letters, 2872 (1998).

Mattoussi, Hedi, et al., "Photoluminescence quantum yield of pure and molecularly doped organic solid films," Journal of Applied Physics, (1999), vol. 86:5, p. 2642.

Mori, T., et al., "Electroluminescence of organic light emitting diodes with alternately deposited dye-doped aluminum quinoline and diamine derivative," Journal of Physics D—Applied Physics, (1999), vol. 32:11, pp. 1198-1203.

Ohmori, Yutaka, et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka, et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, Martin, et al., "Electrophosphorescent p-i-n organic light-emitting devices for very-high-efficiency flat-panel displays," Advanced Materials, (2002), vol. 14:22, Nov. 18, 2002, pp. 1633-1636.

Ping Lu et al., "Synthesis of octasubstituted cyclooctatetrainees and their use as electron transporters in organic light emitting diodes," Journal of the American Chemical Society, 2000, vol. 1222, pp. 7480-7486.

Pope, et al., "Single positive or negative carriers in organic crystals," Electronic Processes in Organic Crystals and Polymers, Oxford Science Publications, Oxford University Press, (1999), pp. 202-207.

Pudzich, R., et al., "Synthesis and characterization of new oxadizoleamine based spiro-linked fluorescence dyes," Synthetic Metals, 2003, vol. 138, pp. 21-31.

Quast, Helmut and Schmitt, Edeltraud; "Note Regarding the Quaternization of Heterocycles," Institute of Organic Chemistry at the University of Wurzburg, 101, pp. 4012-4014, 1968.

R. Schlaf et al., "Homo/Lumo Alignment at PTCDA/ZnPc and PTCDA/ClInPc Herointerfaces Determined by Combined UPS and XPS Measurements," J. Phys. Chem. B 1999, 103, pp. 2984-2992.

R.C. Haddon et al., "Conducting films of C60 and C70 by alkali-metal doping," Nature, vol. 350, Mar. 28, 1991, pp. 320-322.

Redecker, M., et al., "Electron transport in starburst phenylquinoxalines," Applied Physics Letters, Jul. 5, 1999, vol. 75, No. 1, pp. 109-111.

S. Hamm, "Rectifying organic juntions of molecular assemblies based on perylene ion salts," J. Chem. Phys., vol. 103, No. 24, Dec. 22, 1995, pp. 10689-10695.

Sakamoto, Gosuke, et al., "Significant improvement of device durability in organic light-emitting diodes by doping both hole transport and emitter layers with rubrene molecules," Applied Physics Letters, (1999), vol. 75:6, pp. 766-768.

Sanford, J.L., et al., SID 03 Digest, "TFT amoled pixel circuits and driving methods," pp. 10-13.

Sato, N., et al., J. Chem. Soc. Faraday Trans. 3, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Stephen F. Nelsen, "Heterocyclic Radical Anions. II. Naphthalic and 1,4,5,8-Naphthalenetetracarboxylic Acid Derivatives," Journal of the American Chemical Society, 89:23, Nov. 8, 1967, pp. 5925-5931.

Takashi Muramatsu, et al., "Preparation and Properties of a novel heterocyclic dispiro compound, 3, 10-diaza-N, N-dimethyldispiro[5.0.5.3]pentadeca-1,4,8,11-tetraene," Chemistry Letters, pp. 151-152, 1996.

A. G. Werner, et al., "Pyronin B as a donor for n-type doping of organic thin films," Applied Physics Letters, vol. 82, No. 25, Jun. 23, 2003, pp. 4495-4497.

A. J. Bard, L. R. Faulkner, "Electrochemical Methods: Fundamentals and Applications," Wiley, 2nd Ed., 2000, pp. 52-55, Appendix C pp. 808-813.

A. Nollau et al., "Controlled n-type doping of a molecular organic semiconductor: naphthalenetetracarboxylic dianhydride (NTCDA) doped with bis(ethylenedithio)tetrathiafulvalene (BEDT-TTF)," J. Appl. Phys., vol. 87, No. 9, May 1, 2006, pp. 4340-4343.

A. P. Kulkarni et al., "Electron transport materials for organic light-emitting diodes," Chem. Mater. 2004, 16, pp. 4556-4573.

Adachi C. et al., "High-efficiency organic electrophorescent devices with tris (2-phenylpyridine) iridium doped into electron-transporting materials," App. Phys. Lett. vol. 77, No. 6, Aug. 7, 2000.

Adachi, Chihaya, et al., "Efficient electrophosphorescence using a doped ambipolar conductive molecular organic thin film," Organic Electronics 2, (2001), pp. 37-43.

Adachi, Chihaya, et al., "Nearly 100% internal phosphorescence efficiency in an organic light emitting device," Journal of Applied Physics (2001), vol. 90:10, pp. 5048-5051.

Ammermann, Dirk, Dirk et al., "Photonic devices based on crystalline organic semiconductors for optoelectronic integrated circuits," Jps. J. Appl. Phys. Pt. 1 (1995) vol. 34, pp. 1293-1297.

B. A. Gregg et al., "On the superlinear increase in conductivity with dopant concentration in excitonic semiconductors," Applied Physics Letters, vol. 84, No. 10, Mar. 8, 2004, pp. 1707-1709.

B. Maennig et al., "Organic p-i-n solar cells, App. Phys. 2004, A 79, pp. 1-14."

B.W. D'Andrade et al., "Relationship between the ionization and oxidation potentials of molecular organic semiconductors," Organic Electronics 6, 2005, pp. 11-20.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, Marc, et al., "Organic vapor phase deposition," Advanced Materials, 1998, 10, No. 18, pp. 1505-1514.

Bastard, G., "Wave mechanics applied to semiconductor heterostructures," The Editions of Physique, (1988) pp. 64-67.

Blochwitz, J. et al., Org. Electronics 2, 97 (2001).

Birnstock, J., et al., "Method for depositing a vapour deposition material," U.S. Appl. No. 12/134,469.

Blochwitz, J., et al., "Non-polymeric OLEDs with a doped amorphous hole transport layer and operating voltages down to 3.2 V to achieve 100 cd/m2," Synthetic Metals, (2002), vol. 127, pp. 169-173.

Bloom, C. J. et al., "Low work function reduced metal complexes as cathodes in organic electroluminescent devices," J. of Physical Chemistry B, vol. 107, No. 13, pp. 2933-2938.

Campbell, Alasdair, J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chassot L. and Von Zelewsky A., Inorg. Chem., 26, 281 (1987).

Chimed Ganzorg et al., "p-Typed Semiconducts of Aromatic Diamines Doped with SbC15," Chemistry Letters 2000, pp. 1032-1033.

Chung-Chih Wu et al., "Efficient organic blue-light-emitting devices with double confinement on terfluorenes with ambipolar carrier transport properties," Advanced Materials, Jan. 5, 2004, vol. 16, No. 1, pp. 61-65.

Connelly, N. G. et al., Chem. Rev., 96, 877 (1996).

D. Oeter et al., "Doping and Stability of Ultrapure alpha-oligothiophene Thin Films," Synthetic Metals, 61, 1993, pp. 147-150.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W, et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Deluca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Du-Zen Peng et al., "P-134: Novel Pixel Compensation Circuit for AMOLED Display," 2005 SID International Symposium, SID 05 Digest, San Jose, CA May 24, 2005, pp. 814-817.

Elwell, D., "Electrocrystallization of semiconducting materials from molten salt and orgnaic solutions," Journal of Crystal Growth, vol. 52, 1981, pp. 741-752.

Fenghong Li et al., "Leuco Crystal Violet as a dopant for n-doping of organic thin films of fullerene C60," J. Phys. Chem. B 2004, 108, pp. 17076-17088.

G. D. Sharma et al., "Influence of Iodine on the Electrical and Photoelectrical Properties of Zinc Phthalocyanine Think Film Devices," Materials Science and Engineering, B41, 1996, pp. 222-227.

G. Klopman, "Chemical Reactivity and the Concept of Charge-and Frontier-controlled reactions," Journal of the American Chemical Society., vol. 90, No. 2, Jan. 17, 1968, pp. 223-234.

G. Parthasarthy, et al., "Lithium doping of semiconducting organic charge transport materials," J. Appl. Phys., vol. 89, No. 9, May 1, 2001, pp. 4986-4992.

Gao Y. et al., "Cs doping and energy level shift in CuPC", Chemical Physics Letters. North-Holland, Amsterdam, NL, vol. 380, Oct. 21, 2003, p. 451-455.

Grimmett M. Ross, "Imidazole and benzimidazole synthesis," Tables of Contents, pp. 1-10, Academic Press, Harcourt Brace & Company, Publishers, London, San Diego, NY, Boston et al., 1997.

Hararada Kentaro et al., "Realization of organic pn-homojunction using a novel n-type doping technique," Proceedings of SPIE—The international Society for Optical Engineering; Organic Optoelectronics and Photonics 2004, vol. 5464, Sep. 2004, pp. 1-9.

Heinze, Jurgen et al., "Polarographic studies of the conformation of 1,2,3,4,5-pentaarylimidazolium cations," The Institute for Physical Chemistry at the University of Freiburg, pp. 1-22, 1972.

Hideyuki Murata, et al., "Efficient organic light-emitting diodes with undoped active layers based on silole derivatives," Applied Physics Letters, Jan. 14, 2002, vol. 80, No. 2, pp. 189-191.

Hino Yuichi, et al., "Efficient low molecule phosphorescent organic light emitting diodes fabricated by wet-processing," Organic Electronics, Aug. 8, 2004, vol. 5, pp. 265-270.

Huang, Jingsong, et al., "Effect of well number on organic multiple-quantum-well electroluminescent device characteristics," Applied Physics Letters, (1998), vol. 73:23, pp. 3348-3350.

Huang, Jingsong, et al., "Influence of the thickness and doping of the emission layer on the performance of organic light-emitting diodes with PiN Structures," Journal of Applied Physics, (2003), vol. 93:2, pp. 838-844.

Search Report issued in corresponding European Patent Application No. 06 009 885.2.

Search Report issued in corresponding Korean Patent Application No. 2006004075.

Search Report issued in corresponding Japanese Application No. 2006148615.

Search Report issued in corresponding Taiwanese Application No. 095117553.

\* cited by examiner

TRANSPARENT LIGHT-EMITTING COMPONENT

CROSS-REFERENCE TO RELATED APPLICATION

Applicants hereby claim priority under 35 U.S.C. 119(a) to European Patent Application No. EP 05 011 427.1, filed May 27, 2005 and European Patent Application EP 05 015 072.1, filed Jul. 12, 2005, the disclosures of which are expressly incorporated herein by reference in its entirety.

The invention relates to a transparent light-emitting component, in particular an organic light-emitting diode (OLED).

BACKGROUND OF THE INVENTION

Organic light-emitting diodes have undergone a very rapid development in recent times. Even though they were developed for the first time in 1987 for vapor-deposited organic materials (cf. Tang et al., Appl. Phys. Lett. 51 (12), 913 (1978)) for deposited polymer materials from liquid solution (cf. J. H. Burroughes et al., Nature 347, 6293 (1990)), excellent parameters for the efficiency and life service duration of organic light-emitting diodes were already achieved in recent years. In particular, efficiencies of over 80 lumen/w were successfully obtained for green-emitting light-emitting diodes (cf. He et al., Appl. Phys. Lett. 85, 3911 (2004)). Comparably good values were already achieved also for red-emitting and blue-emitting organic light-emitting diodes.

As also the lifetime of these systems has grown very quickly and, in the meantime, values of 10,000 hours for some material systems have even been significantly exceeded, organic light-emitting diodes also appear interesting for applications in lighting systems. The essential advantages of the organic light-emitting diodes, in addition to the possible high efficiency, which even today exceeds that of incandescent bulbs and will in future possibly reach the efficiency of fluorescent tubes, are the possibility of realizing a large-surface lighting unit through which a very glare-free and for many applications ideally suitable light can be generated.

The conventional structural arrangement of organic light-emitting diodes comprises a transparent substrate, glass in most cases, which is coated with a transparent anode that is frequently formed from indium tin oxide (ITO). Onto this, active organic layers are deposited and, subsequently and additionally, a metallic cathode for electrical contacting is deposited. If some volts are applied between the metallic cathode and the transparent anode, the light-emitting diode emits the light through the substrate.

There are also technical concepts that allow the construction of light-emitting diodes, which are at least partially transparent. For this purpose, for example, the cathode can also be provided with a transparent conductive metal or with a thin and partially transparent metal layer (cf. Gu et al., Appl. Phys. Lett. 68, 2606 (1996); Parthasaray et al., Appl. Phys. Lett. 76, 2128 (2000)). In the arrangements proposed up to now, the light of the light-emitting diode is then emitted in both directions, where the exact ratio of the light volumes radiated in both directions depends on the structural configuration of the layer arrangement. This is useable for some applications, for example displays, which are to be read from both sides.

However, it is frequently disadvantageous if a transparent light-emitting diode emits to both sides. On the other hand, it would be very favorable if it were possible to realize organic light-emitting diodes, which are transparent and at the same time emit with significant preference in one direction. With regard to the initial concepts known from the literature, the light intensities in both directions are approximately equal (cf. Gu et al., Appl. Phys. Lett. 68, 2606 (1996); Parthasaray et al., Appl. Phys. Lett. 76, 2128 (2000)).

SUMMARY OF THE INVENTION

The object of the invention is to create a transparent light-emitting component, which is better and more suitable for lighting purposes.

This object is solved by a transparent light-emitting component according to claim 1. Advantageous embodiments of the invention are subject-matter of dependent Sub-Claims.

According to the invention a transparent light-emitting component is created, in particular an organic light-emitting diode (OLED), with a layer arrangement in which a light-emitting organic layer is arranged between an upper and a lower electrode, the layer arrangement being transparent in a switched-off state and emitting light, which is produced in the light-emitting organic layer by applying an electric voltage to the upper and the lower electrode in a switched-on state and which is radiated, which light is radiated in a ratio of at least approximately 4:1 through the upper or the lower electrode, and in which a stack, which is transparent in the visible spectral region and of dielectric layers, being arranged on the side of the upper or the lower electrode.

With the help of the invention it is made possible to achieve, on the one hand and in the switched-off condition of the light-emitting component, a high optical transparency in the visible spectral region. On the other hand, the component in the switched-on condition can emit white or also colored light preferentially in one direction where a ratio of approximately 4:1 is achieved or exceeded. For the component as proposed, an integration of a light-emitting layer arrangement involving preferably an organic light-emitting diode is envisaged with a stack of dielectric layers. With the help of this arrangement, the wavelengths of the light generated in the light-emitting organic layer are emitted preferably in one direction.

The stack of dielectric layers in one embodiment is arranged in such a way that, in one limited spectral region, which overlaps at least partially with the emission spectrum of the light produced in the light-emitting organic layer, there is a high reflection power (>90%), where a reflection power of >99% can be formed with several layers. In this way a substantial part of the light produced in the light emitting organic layer, which on its part can be formed as a layer sequence, emits only in one direction, therefore preferably through the upper or the lower electrode.

At the same time the transmission of the component in the entire visible spectral region is very high. This can be achieved, for example, in that the stack of dielectric layers is designed in such a way that the reflection band is so narrow that only the essential parts of the emission of the light-emitting organic layers are reflected. The design of the stack of dielectric layers can in this way, in addition to the λ/4-layers, which are used in the most plain form of such a reflecting arrangement, also contain multiples of this thickness for one or both partial components of the layer stack, through which the spectral reflection width is reduced (cf. Macleod, Thin Film Optical Filters, 3rd ed., IOP Publishing 2001). In order to obtain a highest possible transmission, the layer thickness of the normally used transparent contact material indium tin oxide (ITO) is optimized; calculations show, for example, that this is the case for the layer thickness λ/4.

The arrangement proposed here can also be advantageously extended in this embodiment to that extent that the stack of dielectric layers preferentially reflects not only one wavelength but rather that several narrow wavelength sectors are reflected. This can be achieved either by means of the sequential separation of several stacks with various thicknesses of the individual layers or by means of utilization of the higher orders of reflection of a plain layer stack. In this way, it is also possible, for example, to realize a white-emitting transparent organic light-emitting diode as well.

In a further embodiment the dielectric layers are used with a thickness of λ/4 and modulated or continually varied refractive index profile, the so-called rugate filter. With a suitable design, these provide the advantage of the suppression of the reflection bands occurring with conventional Bragg mirrors outside of the range of the co-targeted high reflection. The use of such a dielectric filter enables the reflection in the desired spectral range with an efficiency of >99% and a likewise very high transparency (>90%) in the other sectors of the visual spectrum.

The principle as proposed here is usable on a very general scale and is, for example, independent of the exact nature of the layer arrangement. For example, it is usable both for layer arrangements deposited from the solution as well as for layer arrangements vapor-deposited in the vacuum. Furthermore, it can also be used for organic light-emitting diodes if these are monolithically integrated in a stack consisting of one or several diodes. The radiated light in this case is produced with the help of several organic light-emitting diodes,

DESCRIPTION OF PREFERRED EMBODIMENTS OF THE INVENTION

The invention is explained in greater detail on the basis of embodiment examples with reference to the Figures of a drawing.

Figure 2:
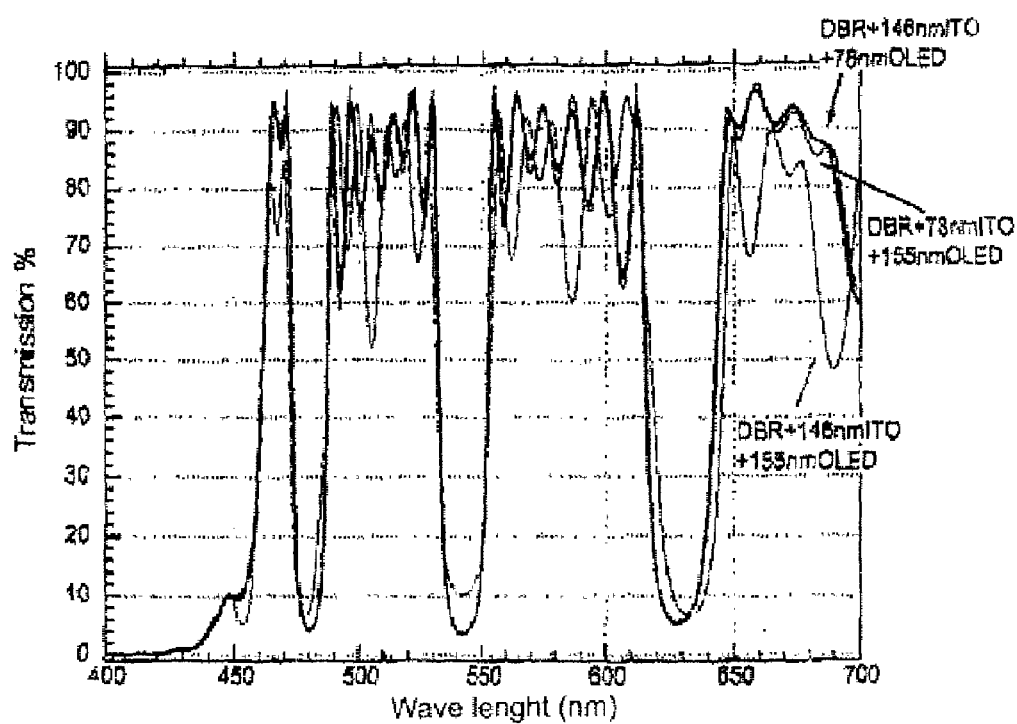
Figure 3A:
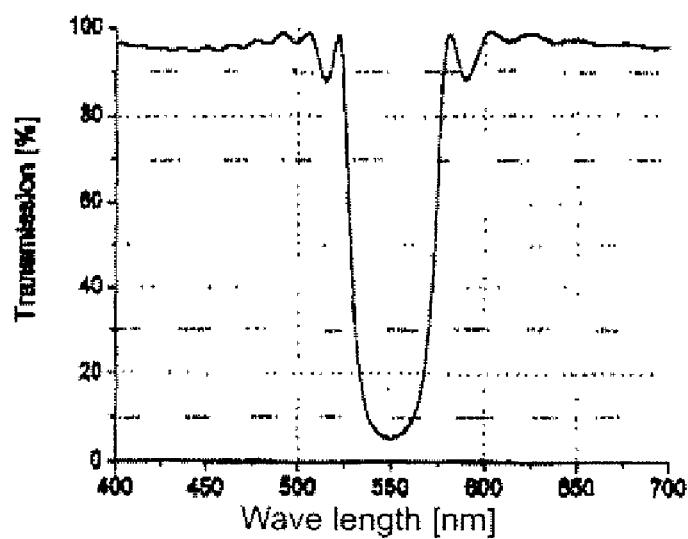
Figure 3B:
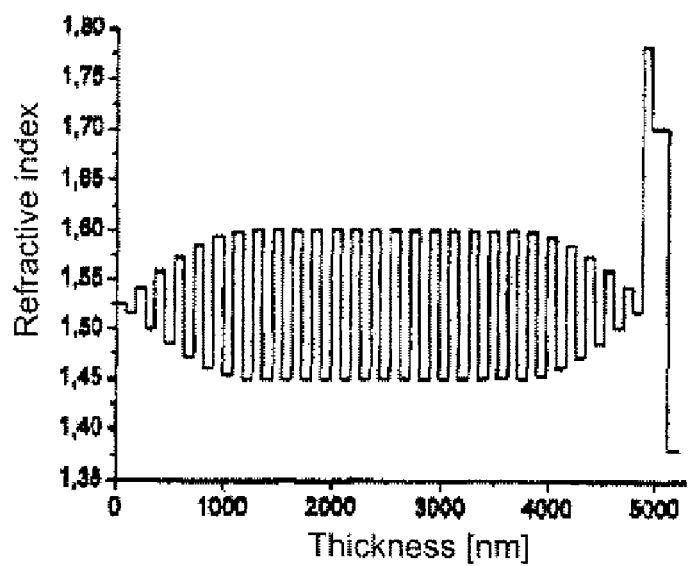

These Figures show the following:

FIG. 1: a schematic illustration of a transparent layer arrangement for a light-emitting component;

FIG. 2: a transmission spectrum for an embodiment of a layer arrangement according to FIG. 1; and FIG. 3a and 3b: a transmission spectrum and a refractive index distribution for a further embodiment of a layer arrangement according to FIG. 1 with modulated refractive index.

FIG. 1 shows a schematic illustration of a transparent layer arrangement for a light-emitting component, in particular an organic light-emitting diode (OLED). On a substrate 1, a stack 2 of dielectric layers is arranged, to which a lower transparent electrode 3 follows. An upper transparent electrode 4 is arranged opposite the lower electrode 3. An organic area 5 is arranged between the lower and the upper electrode 3, 4. The organic area 5 is formed from one or several organic materials and contains at least one light-emitting organic layer in which light is generated when applying an electric voltage to the lower and to the upper electrode 3, 4. The light-emitting organic layer is selectively formed as a single layer or as a series of layers, as is known in various types for organic light-emitting diodes. In a similar manner, the organic area 5 can comprise further organic layers, for example doped or non-doped hole or electron transport layers. Intermediate layers can also be envisaged. The completion of the transparent layer arrangement is formed by an encapsulation 6, which serves the purpose of excluding environmental influences.

An advantageous embodiment of a layer arrangement according to FIG. 1 for a transparent light-emitting component comprises the following layers/layer sequences:

1. Carrier, substrate,
2. Stack of materials (dielectrics) transparent in the visible spectral region, for example, five layers $SiO_2/TiO_2$ each having a thickness of λ/4,
3. Transparent electrode, for example ITO, holes-injecting (anode),
4. p-doped, holes-injecting and transporting layer,
5. Light-emitting organic layer (selectively doped with emitter dye),
6. n-doped, electrons-injecting and transporting layer,
7. Transparent electrode, electrons-injecting (cathode),
8. Encapsulation for excluding environmental influences.

The layers numbered 4 to 6 form in turn the organic area 5 (cf. FIG. 1).

For the realization of a transparent organic light-emitting diode that emits in two or three wavelength ranges, several stacks of dielectric layers each having an individual single layer thickness of λ/4 can be placed one on top of the other. In this way spectral bands are reflected in each case and, in the superimposition, give the desired spectrum of the emitted light.

There is a further option in the use of higher orders of a periodic stack of dielectric layers. With a λ/4-arrangement, these higher orders lie in each case at the half wavelength of the next lowest order. For this reason, a superimposition of several bands could hardly be attained in this way within the visible spectral range. However, if pluralities of λ/4-layer thicknesses are used for the longest wavelength to be superimposed, several spectral regions within the visible light can be superimposed in this way from a stack of dielectric layers with uniform layer thicknesses.

A preferred embodiment example shows the transmission spectrums illustrated in FIG. 2 and has the following structural configuration:

1. Carrier, substrate, glass,
2. Stack of dielectric layers ("Distributed Bragg Reflector, DBR) from materials (dielectrics) transparent in the visible spectral region with three double layers SiO2/TiO2 each having a thickness of 13λ/4,
3. Transparent electrode, ITO for example, holes-injecting (anode), thickness 146 nm (thick, unbroken and dotted line in FIG. 2) or 73 nm (thin, unbroken line in FIG. 2),
4. p-doped, holes-injecting and transporting layer,
5. Light-emitting layer (selectively doped with emitter dye),
6. n-doped, electrons-injecting and transporting layer,
7. Transparent electrode, electrons-injecting (cathode),
8. Encapsulation for excluding environmental influences.

The layers numbered 4 to 6 again form the organic area.

FIG. 2 shows the transmission spectrum of such an arrangement, where the encapsulation in the optical modeling is not taken into consideration. The entire thickness of the organic layers 3 to 5 was assumed with 78 nm (thick, unbroken line) or 155 nm (dotted and thin unbroken line), the layers 6 and 7 were modeled as a λ/4-layer with the refractive index 1.38. The result here is that this arrangement shows in each case a high reflection at approx. 630 nm, 540 nm and 480 nm. In this way, a strong asymmetrical emission can be achieved with such an arrangement, even though the entire transmission is still greater than 60%.

A further preferred embodiment example has the following structural configuration:

1. Carrier, substrate, glass,
2. Stack of dielectric layers from materials (dielectrics) transparent in the visible spectral region with, in part, modulated refractive index between 1.45 (for example $SiO_2$) and 1.6 (for example $Al_2O_3$), 3. Transparent electrode, ITO for example, holes-injecting (anode), thickness 77 nm
4. p-doped, holes-injecting and transporting layer,
5. Light-emitting layer (selectively doped with emitter dye),
6. n-doped, electrons-injecting and transporting layer,
7. Transparent electrode, electrons-injecting (cathode),
8. Encapsulation for excluding environmental influences.

FIG. 3a shows the transmission behavior for the further embodiment example without consideration of the encapsulation. The stack of dielectric layers comprises 54 layers with, in part, sinus-shaped modulated refractive index and is constructed for a maximum reflection wavelength of 550 nm.

FIG. 3b shows a varying refractive index distribution in the stack of dielectric layers, one of the varying refractive indices being allocated to each dielectric layer in the stack. There is a 77 nm thick layer ITO on the stack of dielectric layers. The entire is thickness of the organic layers is 162 nm, that of the 7 th layer (transparent electrode) 100 nm. This construction enables a high reflection of around 550 nm with an overall transmission of >80%.

It is also possible to envisage a sequence of adjacent layers with continually increasing/decreasing refractive index in at least one partial stack of the stack of dielectric layers. This increase/decrease can be achieved in particular by means of a variation of the layer thickness of the individual layers of the partial stack. Oscillating auxiliary maxima of the stop bands, which are disturbing here, can be suppressed in this way.

The features of the invention as disclosed in this description, in the claims and in the drawing can be of significance both individually as well as in random combination for the realization of the invention in its various embodiment forms.

The invention claimed is:

1. Transparent light-emitting component, with a layer arrangement in which a light-emitting organic layer is arranged between an upper and a lower electrode, the layer arrangement being transparent in a switched-off state and emitting light which is produced in the light-emitting organic layer by applying an electrical voltage to the upper and the lower electrode in a switched-on state and which is radiated, which light is radiated in a ratio of at least approximately 4:1 through the upper or the lower electrode, characterized in that a stack, which is transparent in the visible spectral region, of dielectric layers of two or more materials is arranged on the side of the upper or the lower electrode, each dielectric layer has a thickness of $(n \times \lambda/4)$, wherein n is an uneven number and 3 or larger and $\lambda$ is a wavelength of the emitted light with different refractive indices, and different orders of reflection of the stack are used for different spectral components of the light which is produced in the light-emitting organic layer so that a plurality of reflection bands can be used with the stack having uniform layer thickness, wherein the entire light-emitting component is at least 60% transparent.

2. Transparent light-emitting component according to claim 1, characterized in that the emission spectrum of the light which is produced in the light-emitting organic layer and a spectral reflection region of the stack of dielectric layers, in which the stack of dielectric layers has a high reflecting power (>90%), are formed so as to be at least partly overlapping.

3. Transparent light-emitting component according to claim 1, characterized in that the stack of dielectric layers is applied directly to the upper or the lower electrode.

4. Transparent light-emitting component according to claim 1, characterized in that the light-emitting organic layer is formed as a layer sequence with a plurality of layers.

5. Transparent light-emitting component according to claim 1, characterized in that the layer arrangement is formed to emit white light, the white light being composed of a plurality of spectral components of the light which is produced in the light-emitting organic layer.

6. Transparent light-emitting component according to claim 1, characterized in that the light-emitting organic layer is formed in an organic light-emitting diode, and that at least one further organic light-emitting diode with a further light-emitting organic layer is formed, the organic light-emitting diode and the at least one further organic light-emitting diode being stacked one on top of the other.

7. Transparent light-emitting component according to claim 1, characterized in that at least a part of the dielectric layers of the stack of dielectric layers has a different refractive index in each case.

8. Transparent light-emitting component according to claim 1, characterized in that a modulated refractive index distribution is formed for at least one part of the dielectric layers in the stack of dielectric layers.

9. Transparent light-emitting component according to claim 8, characterized in that the modulated refractive index distribution is formed in an essentially oscillating manner.

10. Transparent light-emitting component according to claim 1, characterized in that a sequence of continually increasing/decreasing refractive indices is formed for at least one part of the dielectric layers in the stack of dielectric layers.

11. Transparent light-emitting component according to claim 1, characterized in that the transparent light-emitting component is an organic light emitting diode.

* * * * *